United States Patent
Chiu et al.

(10) Patent No.: US 11,292,637 B1
(45) Date of Patent: Apr. 5, 2022

(54) CENTRAL SUPPORT DEVICE FOR SUPPORTING PLATE-SHAPED OBJECT AND STORAGE APPARATUS FOR STORING PLATE-SHAPED OBJECT

(71) Applicant: GUDENG PRECISION INDUSTRIAL CO., LTD., New Taipei (TW)

(72) Inventors: Ming-Chien Chiu, New Taipei (TW); En-Nien Shen, New Taipei (TW); Yung-Chin Pan, New Taipei (TW); Chih-Ming Lin, New Taipei (TW); Cheng-En Chung, New Taipei (TW); Po-Ting Lee, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 0 days.

(21) Appl. No.: 17/160,331

(22) Filed: Jan. 27, 2021

Related U.S. Application Data

(60) Provisional application No. 63/081,902, filed on Sep. 22, 2020.

(51) Int. Cl.
  *B65D 85/48* (2006.01)
  *B65D 25/10* (2006.01)

(52) U.S. Cl.
  CPC .................................. *B65D 25/107* (2013.01)

(58) Field of Classification Search
  CPC ......... H01L 21/67309; H01L 21/67369; H01L 21/67383; B65D 25/107; B65D 85/30; B65D 85/48
  USPC .............. 206/454, 710, 711, 832; 211/41.14, 211/41.18
  See application file for complete search history.

(56) References Cited

U.S. PATENT DOCUMENTS

| | | | | | |
|---|---|---|---|---|---|
| 5,890,598 | A | * | 4/1999 | Hayashida | H01L 21/6734 206/710 |
| 6,216,883 | B1 | * | 4/2001 | Kobayashi | H01L 21/68707 211/41.18 |
| 2005/0205502 | A1 | * | 9/2005 | Brown | H01L 21/67309 211/41.18 |
| 2006/0011507 | A1 | * | 1/2006 | Uchida | B65D 85/48 206/711 |
| 2006/0283774 | A1 | * | 12/2006 | Hasegawa | H01L 21/67369 206/725 |

(Continued)

*Primary Examiner* — Luan K Bui

(57) ABSTRACT

A central support device for supporting plate-shaped objects and a storage apparatus for storing the plate-shaped objects are provided and adapted to regulate the heights of support elements and confine front ends thereof to a specified range. The central support device includes a casing, the support elements and height adjustment elements. Partition portions each having a dent portions are disposed at the casing and arranged in the heightwise direction, with a support element receiving slot defined between every two adjacent partition portions. Bottom sides of the dent portions slope in the heightwise direction. One end of each support element is connected to a bottom portion of a corresponding support element receiving slot. The height adjustment elements are disposed in the dent portions, respectively, and extend in the heightwise direction to form top ends for supporting the support elements. The storage apparatus also includes the central support device.

10 Claims, 5 Drawing Sheets

(56) References Cited

U.S. PATENT DOCUMENTS

2007/0006803 A1* 1/2007 Cadwell ............... C30B 25/12
117/200

* cited by examiner

CENTRAL SUPPORT DEVICE FOR SUPPORTING PLATE-SHAPED OBJECT AND STORAGE APPARATUS FOR STORING PLATE-SHAPED OBJECT

CROSS-REFERENCE TO RELATED APPLICATION

This non-provisional application claims priority under 35 U.S.C. § 119(e) on U.S. provisional Patent Application No. 63/081,902 filed on Sep. 22, 2020, the entire contents of which are hereby incorporated by reference.

BACKGROUND OF THE INVENTION

1. Field of the Invention

The present disclosure relates to support devices for plate-shaped objects and storage apparatuses for plate-shaped objects, and in particular to a central support device for supporting a plate-shaped objects and a storage apparatus having the central support device and adapted to store the plate-shaped object.

2. Description of the Related Art

A conventional storage apparatus, for example, wafer pod, is adapted to store a plate-shaped objects and has two opposing sides which support members are mounted on, respectively, to support a plurality of wafers. However, warpage occurs to the central portions of extremely-thin plate-shaped objects, such as wafers and circuit boards, and thus a central support device is required to support the plate-shaped objects. The central support device has one end connected to the rear side of the storage apparatus and the other end extending forward. The other end extends so far that the front end of the central support device is likely to droop. When the extent of the droop exceeds a predetermined range, an operating mechanical arm (for picking and placing the plate-shaped objects) collides with the front end of the central support device, thereby damaging the storage apparatus and the plate-shaped objects.

BRIEF SUMMARY OF THE INVENTION

An objective of the present disclosure is to provide a central support device for supporting plate-shaped objects.

To achieve at least the above objective, the present disclosure provides a central support device for supporting plate-shaped objects, comprising: a casing extending in a heightwise direction, wherein a plurality of partition portions each having a dent portions are disposed at the casing and arranged in the heightwise direction, with a support element receiving slot defined between every two adjacent partition portions, wherein bottom surfaces of the dent portions slope in the heightwise direction, and the dent portions are in communication with the support element receiving slots, respectively; a plurality of support elements each having an end connected to a bottom portion of a corresponding said support element receiving slot; and a plurality of height adjustment elements disposed in the dent portions, respectively, wherein the height adjustment elements extend in the heightwise direction to form top ends for supporting the support elements positioned in the support element receiving slots, respectively.

In an embodiment of the present disclosure, the central support device for supporting plate-shaped objects comprises a plurality of first regulation units each having an end connected to a corresponding said height adjustment element.

In an embodiment of the present disclosure, the partition portions each have a first through hole, and the first regulation units each have another end disposed in a corresponding said first through hole.

In an embodiment of the present disclosure, the central support device for supporting plate-shaped objects comprises a plurality of first moisture-repellent caps disposed at the first through holes, respectively.

In an embodiment of the present disclosure, the central support device for supporting plate-shaped objects comprises a plurality of tightness adjustment elements disposed in the support element receiving slots, respectively, and above the support elements in the heightwise direction, respectively, wherein top sides of the support elements slope in the heightwise direction.

In an embodiment of the present disclosure, the tightness adjustment elements each have a round cross section.

In an embodiment of the present disclosure, the central support device for supporting plate-shaped objects comprises a plurality of second regulation units, wherein an end of each said second regulation unit is connected to a corresponding said tightness adjustment element.

In an embodiment of the present disclosure, the partition portions each have a second through hole which another end of a corresponding said second regulation unit is disposed in.

In an embodiment of the present disclosure, the central support device for supporting plate-shaped objects comprises a plurality of second moisture-repellent caps disposed at the second through holes, respectively.

The present disclosure further provides a storage apparatus for storing plate-shaped objects, comprising: a box, wherein a plurality of lateral support members are mounted on each of two opposing sides of the box; and the central support device for supporting plate-shaped objects, wherein the casing is connected to a rear side of the box.

Therefore, a central support device for supporting plate-shaped objects and a storage apparatus for storing the plate-shaped objects are provided and adapted to regulate the heights of support elements in the heightwise direction and confine front ends of the support elements to a specified range.

DETAILED DESCRIPTION OF THE INVENTION

To facilitate understanding of the object, characteristics and effects of this present disclosure, embodiments together with the attached drawings for the detailed description of the present disclosure are provided.

Figure 1:
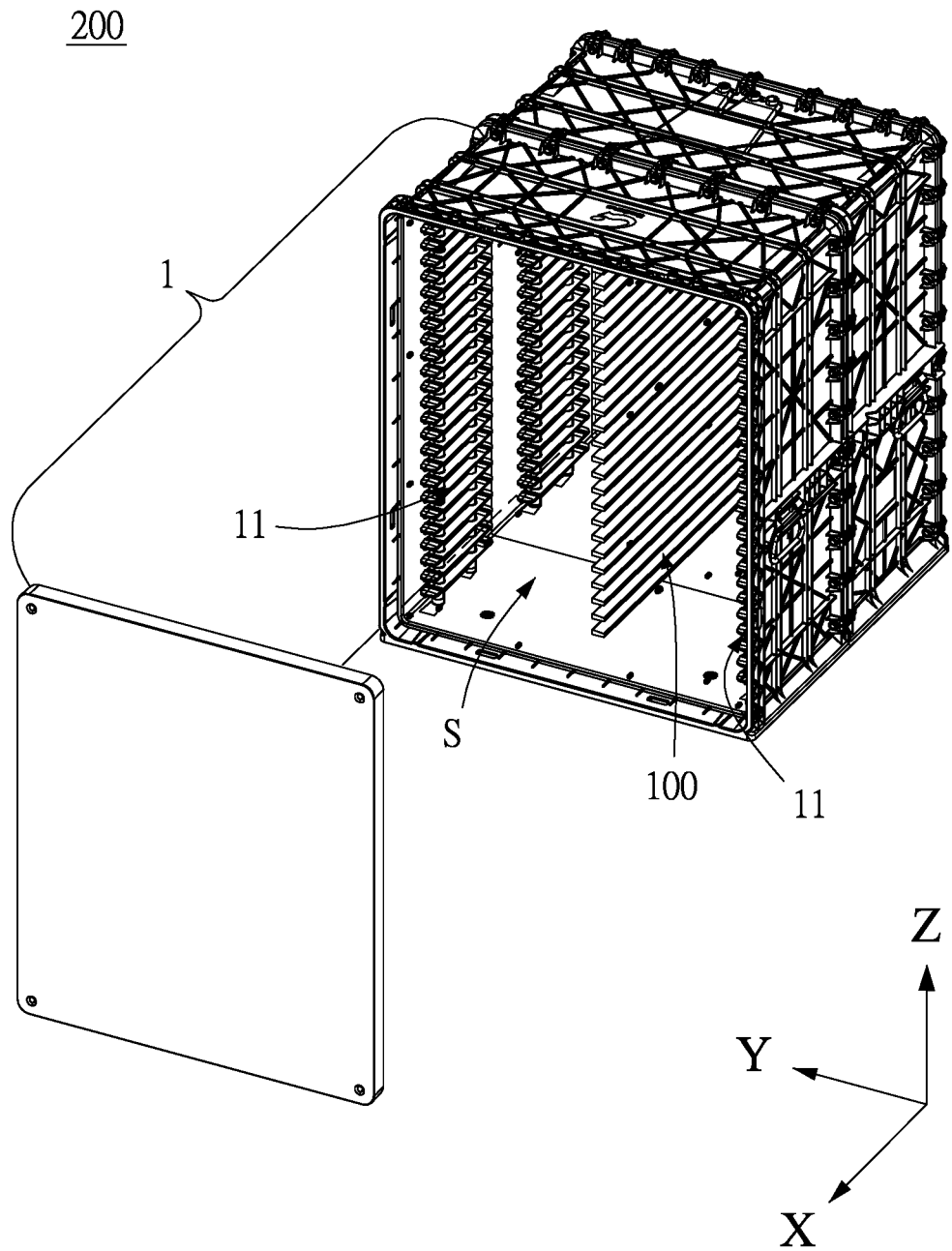
FIG. 1 is a perspective schematic view of a storage apparatus for storing plate-shaped objects according to an embodiment of the present disclosure.

Referring to FIG. 1, a storage apparatus 200 for storing plate-shaped objects according to an embodiment of the present disclosure comprises a box 1 and a central support device 100 for supporting plate-shaped objects.

The box 1 has a receiving space S for storing a plurality of plate-shaped objects, for example, wafers, circuit boards and sheet glass. A plurality of lateral support members 11 are mounted on each of the two opposing sides of the box 1.

Figure 2:
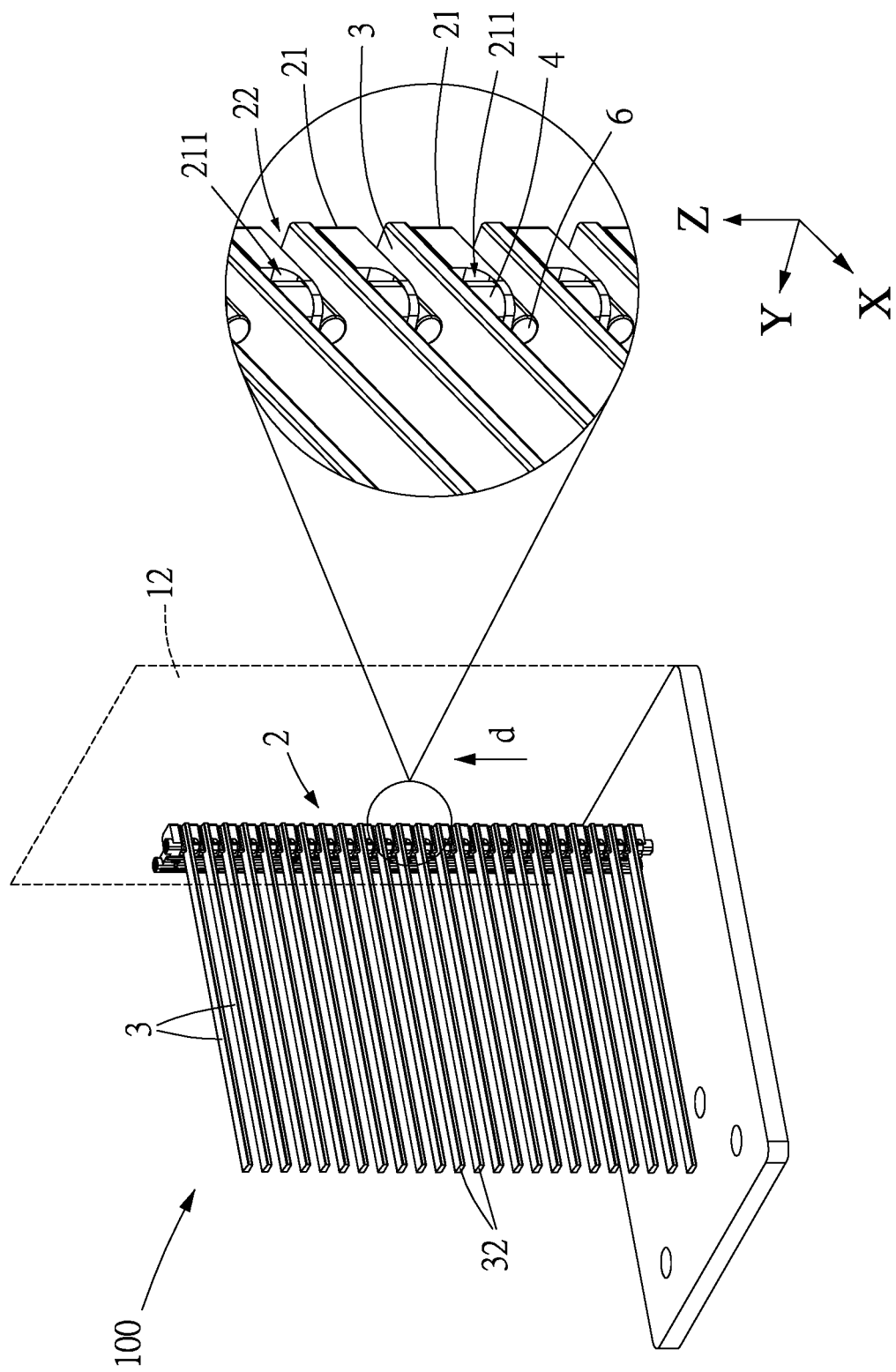
FIG. 2 is a perspective schematic view of a central support device for supporting plate-shaped objects according to an embodiment of the present disclosure.

Referring to FIG. 2, the central support device 100 for supporting plate-shaped objects comprises a casing 2, a plurality of support elements 3 and a plurality of height adjustment elements 4.

The casing 2 is connected to a rear side 12 of the box 1 and extends in a heightwise direction d. A plurality of partition portions 21 are disposed at the casing 2 and arranged in the heightwise direction d. A support element receiving slot 22 is defined between every two adjacent partition portions 21.

One end of each support element 3 is connected to the bottom portion of a corresponding said support element receiving slot 22. The support elements 3 and the lateral support members 11 jointly support the plate-shaped objects. The support elements 3 support the central portions of the plate-shaped objects, respectively. In this embodiment, the support elements 3 are slender, but the present disclosure is not limited thereto. In a variant embodiment, the support elements 3 are of any other structures or shapes. The support elements 3 are made of a high-strength material of a lower weight than the other high-strength materials, such as aluminum alloy and carbon fiber composite, and thus are of high rigidity and low weight.

Figure 3:
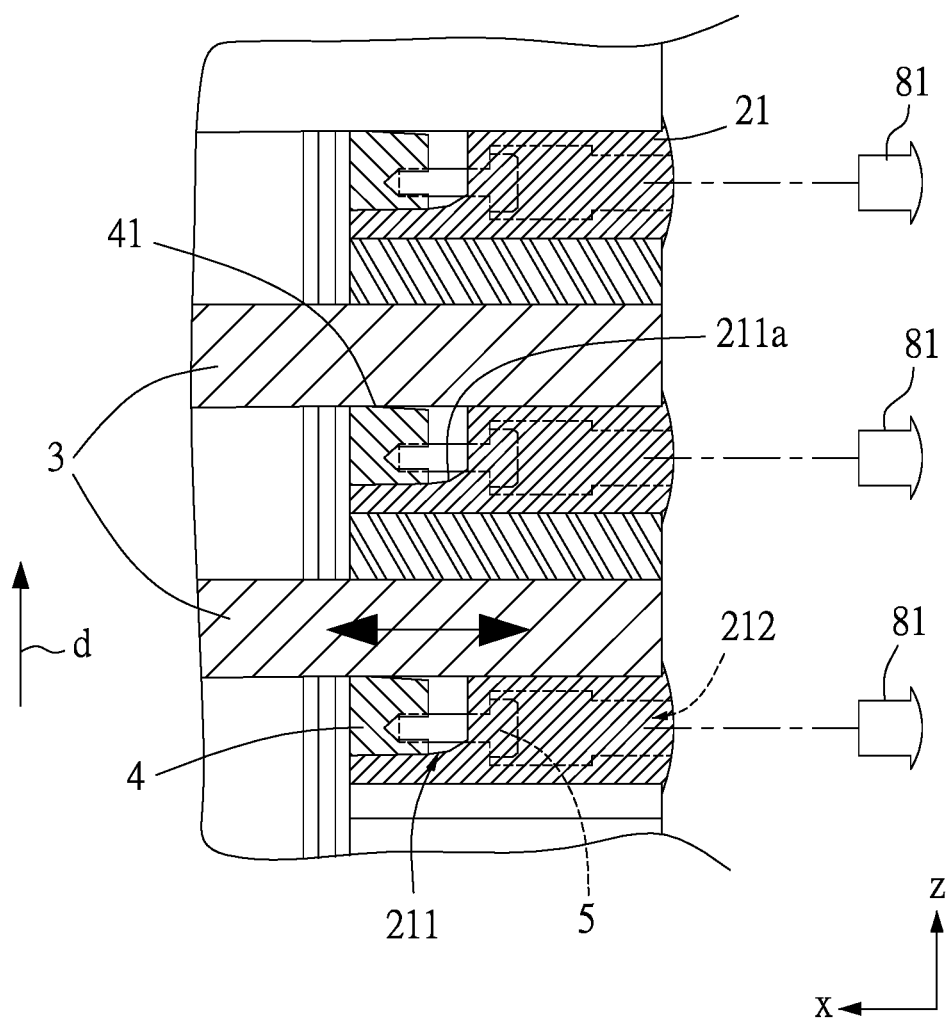
FIG. 3 is a lateral schematic view of the central support device for supporting plate-shaped objects according to an embodiment of the present disclosure.

Referring to FIG. 3, the partition portions 21 each have a dent portions 211. The height of the bottom surfaces 211a of the dent portions 211 changes gradually in the heightwise direction d, and the dent portions 211 are in communication with the support element receiving slots 22, respectively.

The height adjustment elements 4 are disposed in the dent portions 211, respectively. The height adjustment elements 4 extend in the heightwise direction d to form top ends 41 for supporting the support elements 3 positioned in the support element receiving slots 22, respectively.

Since the height of the bottom surfaces 211a of the dent portions 211 changes gradually in the heightwise direction d, the heights of the top ends 41 of the height adjustment elements 4 vary with the positions (indicated by the double arrow shown in FIG. 3) of the height adjustment elements 4 in the dent portions 211 so as to regulate the height of the support elements 3 in the heightwise direction d, thereby confining front ends 32 of the support elements 3 to a specified range.

In this embodiment, the height of the bottom surfaces 211a of the dent portions 211 changes gradually in the heightwise direction d, i.e., in direction X (which is the direction in which the support elements 3 extend), but the present disclosure is not limited thereto. In a variant embodiment, the height of the bottom surfaces 211a of the dent portions 211 changes gradually in the heightwise direction d, i.e., in direction Y or any other direction.

In this embodiment, as shown in FIG. 3, the central support device 100 for supporting plate-shaped objects further comprises a plurality of first regulation units 5. One end of each said first regulation unit 5 is connected to a corresponding said height adjustment element 4. The first regulation units 5 may be regarded as extensions of the height adjustment elements 4 and adapted to enable workers to manually adjust the positions of the height adjustment elements 4. In this embodiment, the first regulation units 5 are lock screws capable of locking to regulate and adjust the positions of the height adjustment elements 4. However, the present disclosure is not limited thereto.

In this embodiment, the partition portions 21 each have a first through hole 212 which the other end of a corresponding said first regulation unit 5 is disposed in. Therefore, the first regulation units 5 are embedded in the partition portions 21 to minimize the volume of the central support device 100. In this embodiment, the first through holes 212 extend in direction X to penetrate the partition portions 21, and the first regulation units 5 extend in direction X to connect to the height adjustment elements 4, but the present disclosure is not limited thereto. In a variant embodiment, the first regulation units 5 extend in any other direction to connect to the height adjustment elements 4, for example, extend in direction Y to penetrate the partition portions 21 and thus connect to the height adjustment elements 4 or are exposed from the partition portions 21 and thus connected to the height adjustment elements 4.

In this embodiment, a plurality of first moisture-repellent caps 81 are disposed at the first through holes 212, respectively, to block moisture. To regulate the heights of the support elements 3, workers remove the first moisture-repellent caps 81 and insert a screwdriver into the first through holes 212 to rotate the first regulation units 5, so as to regulate the positions of the height adjustment elements 4.

Figure 4:
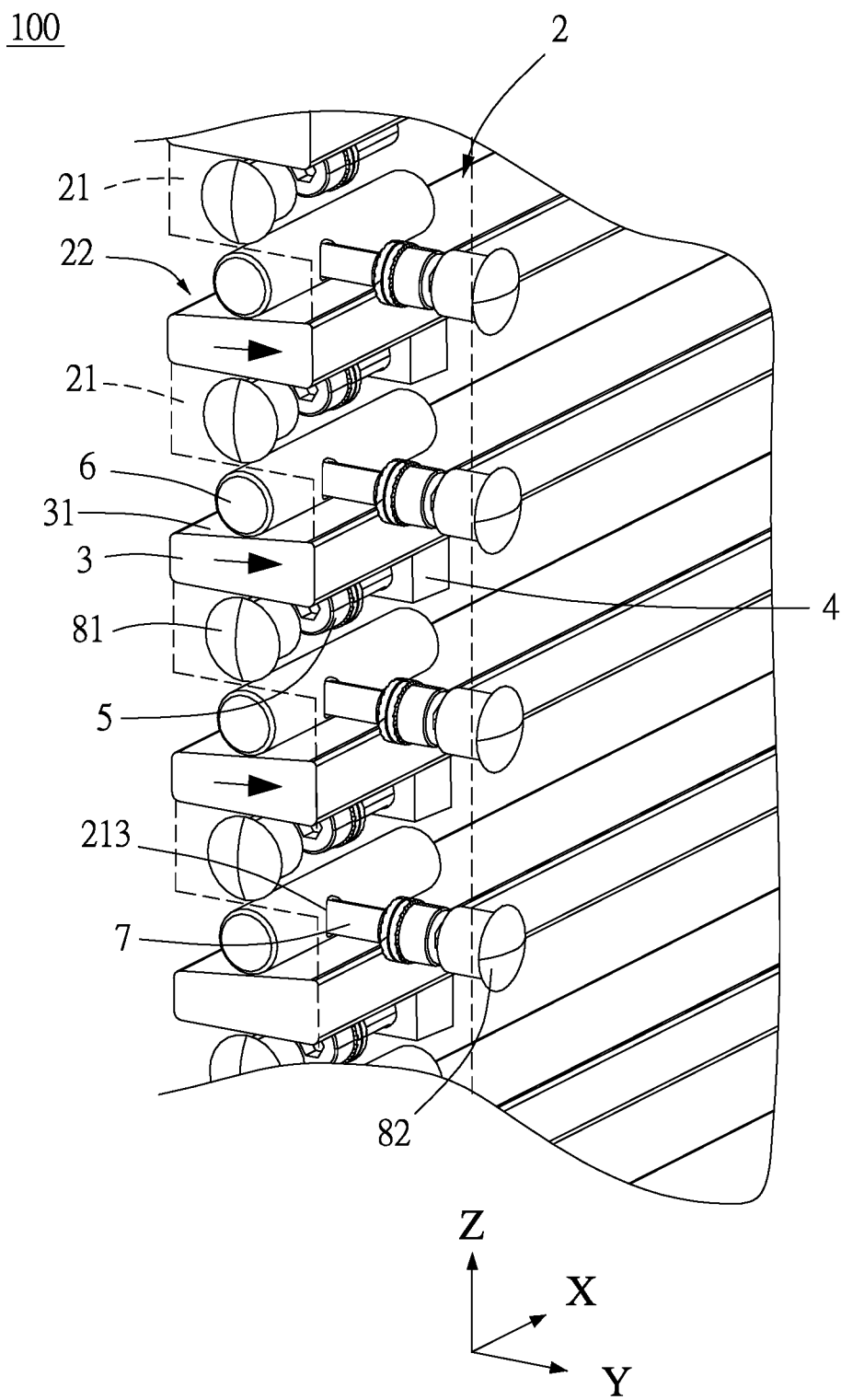
FIG. 4 is a perspective schematic view, from another angle, of the central support device for supporting plate-shaped objects according to an embodiment of the present disclosure.

In this embodiment, as shown in FIG. 4, the central support device 100 for supporting the plate-shaped objects further comprises a plurality of tightness adjustment elements 6 disposed in the support element receiving slots 22, respectively, and above the support elements 3 in the heightwise direction d, respectively. Top sides 31 of the support elements 3 slope in the heightwise direction d. The tightness adjustment elements 6 fit between the underlying top sides 31 of the support elements 3 and the overhanging partition portions 21; thus, workers change the positions (indicated by arrows shown in the diagram) of the tightness adjustment elements 6 in the support element receiving slots 22 to enable the tightness adjustment elements 6 to press against the support elements 3, so as to regulate how tightly the support elements 3 are engaged with the casing 2.

In this embodiment, the top sides 31 of the support elements 3 slope in the heightwise direction d, that is, in the direction perpendicular to the extension direction (direction Y) of the support elements 3. Therefore, the top sides 31 of the support elements 3 slope in direction Y. However, the present disclosure is not limited thereto. In a variant embodiment, the top sides 31 of the support elements 3 slope in the heightwise direction d, that is, slope in direction X or any other direction.

In this embodiment, as shown in FIG. 4, the central support device 100 for supporting plate-shaped objects further comprises a plurality of second regulation units 7. One end of each said second regulation unit 7 is connected to a corresponding said tightness adjustment element 6. The second regulation units 7 may be regarded as extensions of the tightness adjustment elements 6 and adapted to enable workers to manually adjust the positions of the tightness adjustment elements 6. In this embodiment, the second regulation units 7 are lock screws capable of locking to regulate and adjust the positions of the tightness adjustment elements 6. However, the present disclosure is not limited thereto.

In this embodiment, as shown in FIG. 4, the partition portions 21 each have a second through hole 213 which the other end of a corresponding said second regulation unit 7 is disposed in. Therefore, the second regulation units 7 are embedded in the partition portions 21 to minimize the volume of the central support device 100. In this embodiment, second through holes 213 extend in direction Y to penetrate the partition portions 21, and the second regulation units 7 extend in direction Y to connect to the tightness adjustment elements 6, but the present disclosure is not limited thereto. In a variant embodiment, the second regulation units 7 extend in any other direction to connect to the tightness adjustment elements 6, for example, extend in direction X to penetrate the partition portions 21 and thus connect to the tightness adjustment elements 6 or are exposed from the partition portions 21 and thus connected to the tightness adjustment elements 6.

In this embodiment, a plurality of second moisture-repellent caps 82 are disposed at the second through holes 213, respectively, to block moisture. To regulate the tightness of the support elements 3, workers remove the second moisture-repellent caps 82 and insert a screwdriver into the second through holes 213 to rotate the second regulation units 7, so as to regulate the positions of the tightness adjustment elements 6.

Figure 5:
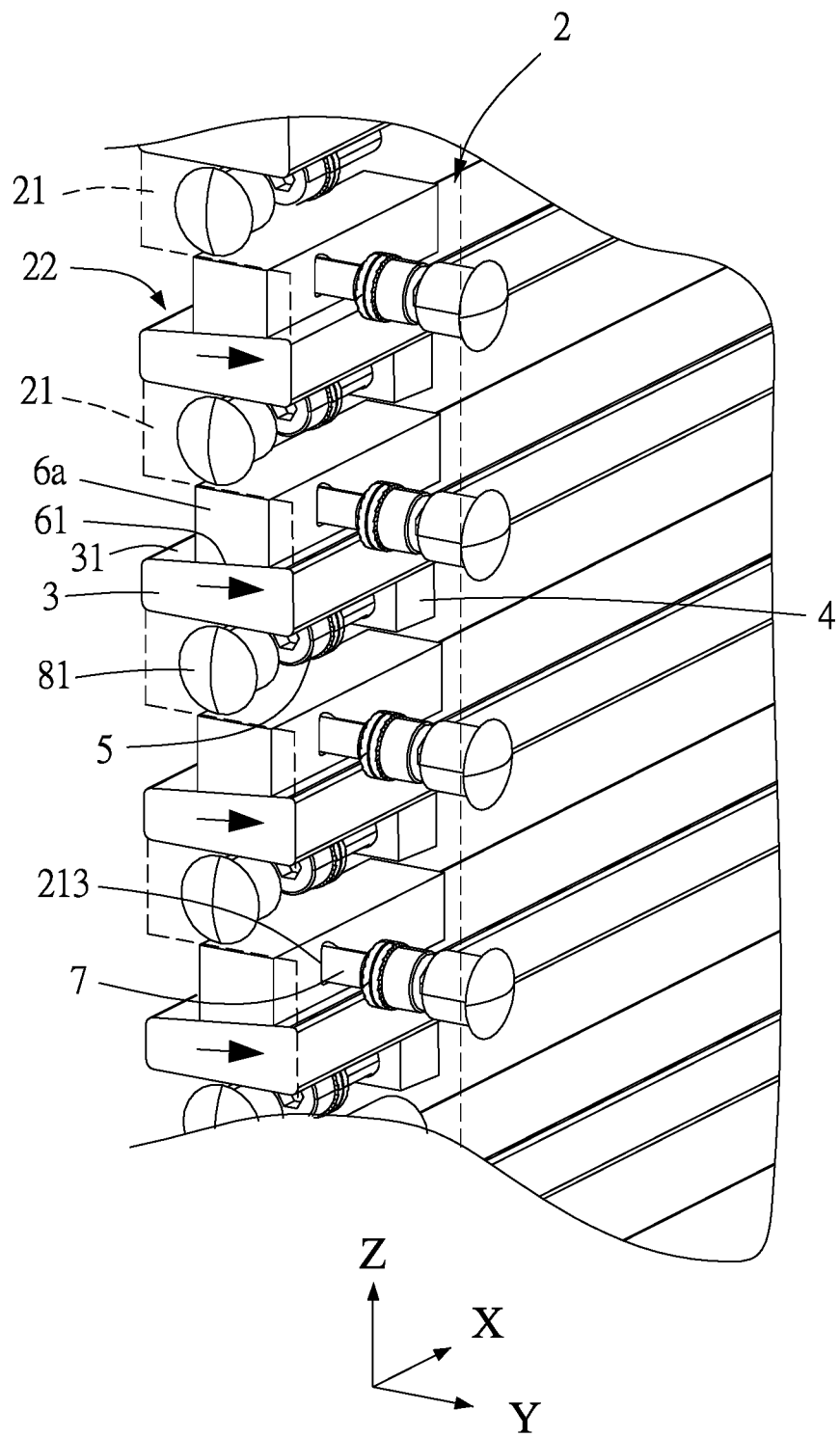
FIG. 5 is a perspective schematic view of tightness adjustment elements of FIG. 4 in another aspect.

In this embodiment, the tightness adjustment elements 6 have round cross sections and are rod-shaped, but the present disclosure is not limited thereto. As shown in FIG. 5, the tightness adjustment elements 6a have wedge-shaped or trapezoidal cross sections and have bottom surfaces 61 abutting against the top sides 31 of the support elements 3.

While the present disclosure has been described by means of specific embodiments, numerous modifications and variations could be made thereto by those skilled in the art without departing from the scope and spirit of the present disclosure set forth in the claims.

What is claimed is:

1. A central support device for supporting plate-shaped objects, comprising:
    a casing extending in a heightwise direction, wherein a plurality of partition portions are disposed at the casing and arranged in the heightwise direction, with a support element receiving slot defined between every two adjacent partition portions, each of the partition portions having a dent portions, wherein height of bottom surfaces of the dent portions changes gradually in the heightwise direction, and the dent portions are in communication with the support element receiving slots, respectively;
    a plurality of support elements each having an end connected to a bottom portion of a corresponding support element receiving slot; and
    a plurality of height adjustment elements disposed in the dent portions, respectively, wherein the height adjustment elements extend in the heightwise direction to form top ends for supporting the support elements positioned in the support element receiving slots, respectively.

2. The central support device for supporting plate-shaped objects according to claim 1, further comprising a plurality of first regulation units each having an end connected to a corresponding one of the plurality of height adjustment elements.

3. The central support device for supporting plate-shaped objects according to claim 2, wherein the partition portions each have a first through hole, and the first regulation units each have another end disposed in a corresponding first through hole.

4. The central support device for supporting plate-shaped objects according to claim 3, further comprising a plurality of first moisture-repellent caps disposed at the first through holes, respectively.

5. The central support device for supporting plate-shaped objects according to claim 1, further comprising a plurality of tightness adjustment elements disposed in the support element receiving slots, respectively, and above the support elements in the heightwise direction, respectively, wherein top sides of the support elements slope in the heightwise direction.

6. The central support device for supporting plate-shaped objects according to claim 5, wherein the tightness adjustment elements each have a round cross section.

7. The central support device for supporting plate-shaped objects according to claim 5, further comprising a plurality of second regulation units, wherein an end of each of the plurality of second regulation units is connected to a corresponding one of the plurality of tightness adjustment elements.

8. The central support device for supporting plate-shaped objects according to claim 7, wherein the partition portions each have a second through hole in which another end of each of the plurality of second regulation units is disposed.

9. The central support device for supporting plate-shaped objects according to claim 8, further comprising a plurality of second moisture-repellent caps disposed at the second through holes, respectively.

10. A storage apparatus for storing plate-shaped objects, comprising:
    a box, wherein a plurality of lateral support members are mounted on each of two opposing sides of the box; and
    the central support device for supporting plate-shaped objects, as recited in claim 1, wherein the casing is connected to a rear side of the box.

* * * * *